(12) United States Patent
Chaney et al.

(10) Patent No.: US 9,287,079 B2
(45) Date of Patent: Mar. 15, 2016

(54) APPARATUS FOR DYNAMIC TEMPERATURE CONTROL OF AN ION SOURCE

(71) Applicant: Varian Semiconductor Equipment Associates, Inc., Gloucester, MA (US)

(72) Inventors: Craig R. Chaney, Gloucester, MA (US); William Davis Lee, Newburyport, MA (US); Neil J. Bassom, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 100 days.

(21) Appl. No.: 14/322,357

(22) Filed: Jul. 2, 2014

(65) Prior Publication Data
US 2016/0005564 A1   Jan. 7, 2016

(51) Int. Cl.
*H01J 27/02* (2006.01)

(52) U.S. Cl.
CPC .................. *H01J 27/022* (2013.01)

(58) Field of Classification Search
None
See application file for complete search history.

(56) References Cited

U.S. PATENT DOCUMENTS

| | | | | |
|---|---|---|---|---|
| 4,157,471 A | * | 6/1979 | Mlekodaj | H01J 27/20 250/423 R |
| 5,523,646 A | * | 6/1996 | Tucciarone | H05H 1/48 250/281 |
| 6,847,043 B2 | | 1/2005 | Murrell et al. | |
| 7,365,339 B2 | * | 4/2008 | Fujita | H01J 27/08 250/423 R |
| 2010/0156198 A1 | | 6/2010 | Cooper et al. | |
| 2011/0240877 A1 | | 10/2011 | Benveniste et al. | |
| 2012/0132802 A1 | | 5/2012 | Arai et al. | |

FOREIGN PATENT DOCUMENTS

| | | | |
|---|---|---|---|
| KR | 20060065703 A | | 6/2006 |
| WO | 2013090123 A1 | | 6/2013 |

OTHER PUBLICATIONS

International Search Report and Written Opinion mailed Sep. 23, 2015 in corresponding PCT application No. PCT/ US2015/035319.

* cited by examiner

*Primary Examiner* — Jack Berman

(57) ABSTRACT

An apparatus for controlling the temperature of an ion source is disclosed. The ion source includes a plurality of walls defining a chamber in which ions are generated. To control the temperature of the ion source, one or more heat shields is disposed exterior to the chamber. The heat shields are made of high temperature and/or refractory material designed to reflect heat back toward the ion source. In a first position, these heat shields are disposed to reflect a first amount of heat back toward the ion source. In a second position, these heat shields are disposed to reflect a lesser second amount of heat back toward the ion source. In some embodiments, the heat shields may be disposed in one or more intermediate positions, located between the first and second positions.

16 Claims, 4 Drawing Sheets

APPARATUS FOR DYNAMIC TEMPERATURE CONTROL OF AN ION SOURCE

FIELD

Embodiments of the present disclosure relate to an apparatus for controlling the temperature of an ion source, and more particularly, an apparatus for dynamically changing the temperature of the ion source.

BACKGROUND

Ion sources are used to ionize gasses that are introduced into the chamber of the ion source. Typically, the ion source has a plurality of walls that define a chamber. A gas is introduced into this chamber. The chamber also has an ion generation mechanism. In some cases, this ion generation mechanism may be an indirectly heated cathode, which emits electrons that serve to ionize the gas in the chamber.

Different gasses are best ionized at different temperatures. For example, larger molecules are preferably ionized at a lower temperature to insure that large molecular ions, rather than smaller ions, are created. Similarly, other species, such as carbon based species, are best ionized at higher temperatures. Additionally, the temperature of the ion source may also affect the lifetime or beam current of the ion source. Species, like carbon, may create residue in the chamber if ionized at low temperatures.

Therefore, it would be advantageous to have an apparatus that changes the temperature of an ion source between relatively hot and cold temperatures without requiring manual intervention.

SUMMARY

An apparatus for controlling the temperature of an ion source is disclosed. The ion source includes a plurality of walls defining a chamber in which ions are generated. To control the temperature of the ion source, one or more heat shields are disposed exterior to the chamber. The heat shields are made of high temperature and/or refractory material designed to reflect heat back toward the ion source. In a first position, these heat shields are disposed to reflect a first amount of heat back toward the ion source. In a second position, these heat shields are disposed to reflect a lesser second amount of heat back toward the ion source. In some embodiments, the heat shields may be disposed in one or more intermediate positions, located between the first and second positions.

According to a first embodiment, an apparatus is disclosed. The apparatus comprises an ion source having a plurality of walls defining a chamber; and a movable heat shield disposed outside the chamber and proximate at least one of the walls, where the movable heat shield has a first position where a first amount of heat is reflected back toward the chamber and a second position where a second amount of heat is reflected back toward the chamber, the second amount of heat being less than the first amount of heat.

According to a second embodiment, an apparatus is disclosed. The apparatus comprises an ion source having a plurality of walls defining a chamber, wherein the plurality of walls comprises a bottom wall, a top wall with an aperture, two end walls and two side walls, where a cathode is disposed proximate one of the two end walls; two movable heat shields, each disposed outside the chamber and proximate a respective one of the two side walls, where each of the two movable heat shields has a first position where a first amount of heat is reflected back toward the chamber and a second position where a second amount of heat is reflected back toward the chamber, where the second amount is less than the first amount; and an actuator in communication with each of the movable heat shields, to move the movable heat shields in a direction parallel to a plane of the side walls between the first position and the second position, wherein in the first position, the movable heat shields overlap a portion of the side walls, and in the second position, the movable heat shields overlap a smaller portion of the side walls.

According to a third embodiment, an apparatus is disclosed. The apparatus comprises an ion source having a plurality of walls defining a chamber, wherein the plurality of walls comprises a bottom wall, a top wall with an aperture, two end walls and two side walls, where a cathode is disposed proximate one of the two end walls; two movable heat shields, each disposed outside the chamber and proximate a respective one of the two side walls, where each of the movable heat shields has a first position where a first amount of heat is reflected back toward the chamber and a second position where a second amount of heat is reflected back toward the chamber, the second amount being less than the first amount; and an actuator in communication with each of the movable heat shields, to rotate the movable heat shields, each about a respective pivot point, wherein in the first position, the movable heat shields form a first angle with the respective side wall, and in the second position, the movable heat shields form a second angle with the respective side wall, greater than the first angle.

BRIEF DESCRIPTION OF THE FIGURES

For a better understanding of the present disclosure, reference is made to the accompanying drawings, which are incorporated herein by reference and in which.

DETAILED DESCRIPTION

As described above, an ion source comprises a plurality of walls that define a chamber. In some embodiments, one or more gasses are introduced into the chamber and are ionized. In other embodiments, a solid material may be disposed in the chamber and sputtered to produce ions. In each of these embodiments, ions are generated in the chamber. An aperture in one of the walls allows the ions to be extracted and directed toward a workpiece.

Figure 1A:
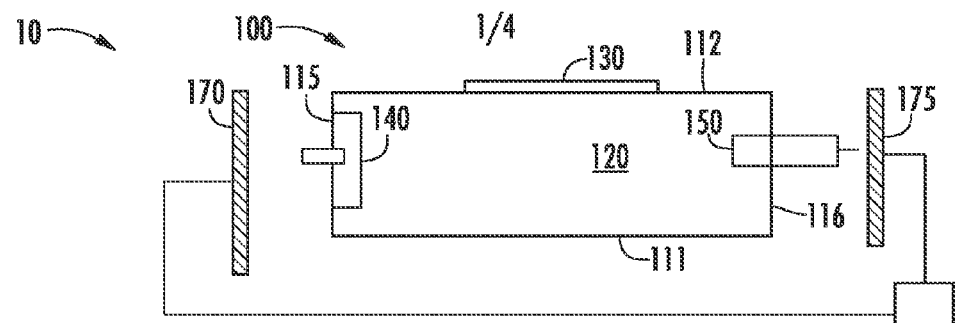
FIGS. 1A-1D show an apparatus according to a first embodiment.
Figure 1B:
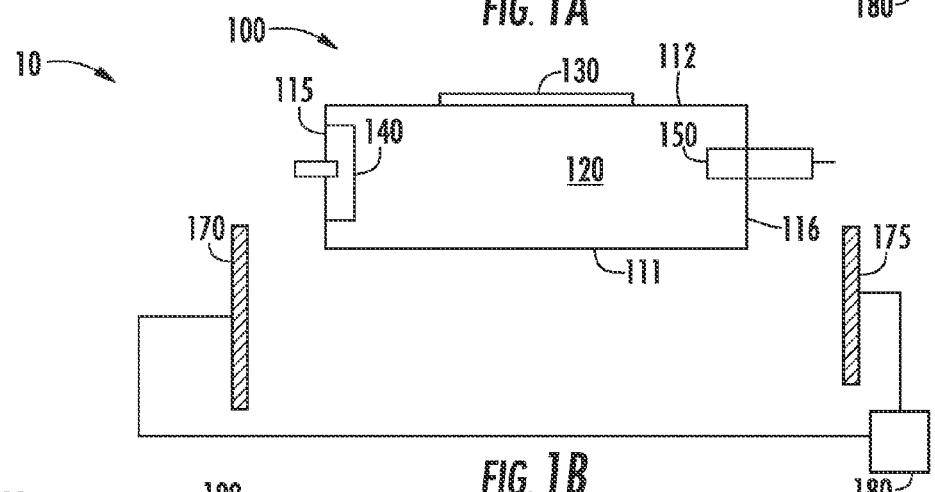
Figure 1C:
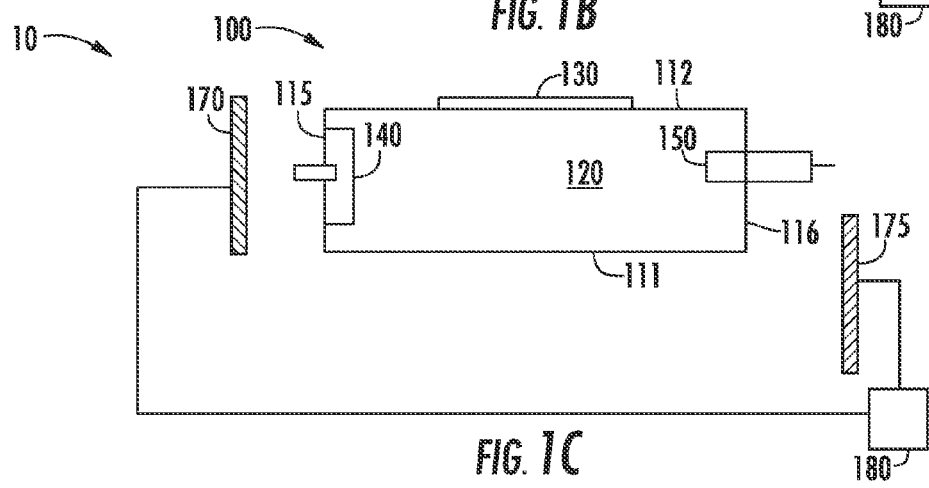

FIGS. 1A-1C show a first embodiment of an apparatus 10. The apparatus 10 includes an ion source 100, and one or more heat shields 170, 175. The ion source 100 has a plurality of walls, which define a chamber 120. The ion source 100 may be shaped as a rectangular prism, having a height, length and width. The ion source 100 has a bottom wall 111, an opposite top wall 112, two opposing sidewalls 113, 114 (see FIG. 2A), and two opposing end walls 115, 116. These walls may define a chamber therein. In other embodiments, the chamber may be separated into multiple compartments. Although the terms "top", "bottom", "side" and "end" are used, they do not indicate that the ion source is positioned in a certain orientation. Rather, these descriptions are used for convenience.

The top wall 112 may have an aperture 130, through which ions are extracted. Outside of the aperture 130 are one or more electrodes (not shown). These electrodes are electrically biased so as to attract positive ions from within the ion source 100 through the aperture 130 and toward the workpiece (not shown).

A cathode 140 may be disposed on one end wall 115. Typically, a filament (not shown) is disposed behind the cathode 140, so as to separate it from the rest of the chamber 120. The filament is energized, causing it to generate thermionic electrons. These electrons strike the cathode 140, causing it to generate and emit electrons into the chamber 120. The cathode 140 may be negatively biased to repel the electrons toward the chamber 120.

A repeller 150 may be disposed on the opposite end wall 116. The repeller 150 may also be negatively biased so as to repel the emitted electrons back toward the center of the chamber 120. In this way, the emitted electrons are repelled at both end walls 115, 116, maximizing the probability that each will collide with a gas molecule and form an ion.

As described above, the temperature of the ion source 100 may affect the lifetime of the ion source 100, as well as the ionization of the selected gas. FIG. 1A shows an apparatus 10 with two movable heat shields 170, 175 in communication with an actuator 180. The first movable heat shield 170 is disposed proximate the end wall 115 having the cathode 140. The second movable heat shield 175 is disposed proximate the end wall 116 having the repeller 150.

In all of the embodiments described herein, these movable heat shields 170, 175 may be fabricated using high refractory materials with low thermal conductivities. For example, the movable heat shields 170, 175 may be constructed of tungsten, molybdenum, nickel, tantalum, alloys thereof, or a similar material. Alternatively, a sandwich of materials having both emissive and thermal conduction properties may be used to enhance the process. These materials may be used alone or may be mounted to a substrate for improved efficiency. These materials may be in the form of a single sheet, or a plurality of layers. Materials, such as tungsten, titanium, and stainless steel, may be used, either as an assembly or may be affixed to a substrate. Of course, other configurations are also possible. The heat shield is comprised of any high temperature, high refractive material that may be used to reflect heat back toward the ion source 100. Additionally, these materials may be stacked, layer or affixed to a substrate, if desired.

FIG. 1A shows the apparatus 10 with the movable heat shields 170, 175 both in a first position, where the heat shields are arranged to reflect a first amount of heat back toward the ion source 100. This may occur when the movable heat shields 170, 175 are adjacent to, or overlap, the majority or the entirety of respective end walls 115, 116. While FIG. 1A shows the movable heat shields 170, 175 covering or overlapping the entirety of respective end walls 115, 116, other embodiments are possible. For example, the movable heat shields 170, 175 may only cover or overlap a portion of respective end walls 115, 116 in the first position. The first position may be selected to achieve the maximum desired temperature of the ion source 100.

The amount of heat that is reflected is based on the amount of overlap between the movable heat shields 170, 175 and respective end walls 115, 116. It may also be based on the distance between the end walls 115, 116 and the movable heat shields 170, 175. The smaller the gap between the end wall and its corresponding movable heat shield, the greater the amount of reflected heat. In addition, the smaller the angle between the end walls 115, 116 and the movable heat shields 170, 175, the greater the amount of reflected heat. Stated differently, maximum heat reflection may occur when the planes of the end wall and its corresponding movable heat shield are parallel to one another. However, it is not necessary that these components be exactly parallel. In fact, any angle can be formed between the end wall and the corresponding movable heat shield. Greater angles may result in less heat reflected back toward the chamber 120 though.

In the first position, a first amount of heat is reflected back toward the ion source 100 due to the position of the movable heat shields 170, 175, causing the chamber 120 to be at a first operational temperature. In some embodiments, this first operational temperature may be the maximum desired temperature.

FIG. 1B shows apparatus 10 with both movable heat shields 170, 175 in a second position. This second position is selected to reflect a second amount of heat toward the ion source 100, where the second amount is less than the first amount. In this second position, there is less overlap than in the first position. In some embodiments, there may be little or no overlap between the end walls 115, 116 and the movable heat shields 170, 175. This reduces the heat that is reflected. In this second position, the temperature of the chamber 120 may be a minimum desired temperature. In other words, in the first position, the movable heat shields 170, 175 overlap a portion of respective end walls 115, 116, while in the second position, the movable heat shields 170, 175 overlap a smaller portion of respective end walls 115, 116.

In some embodiments, an actuator 180 is used to move the movable heat shields 170, 175 between the first position and the second position. This actuator 180 may be any traditional motor, such as a stepper motor, a servo motor, or a pneumatic cylinder having a fixed stroke or multiple strokes. In the case of a cylinder, the first position and the second position may define the endpoints of the stroke.

In any of the embodiments that utilize linear motion, the movable heat shields may be in communication with a set of rails or bushings, which insure that the heat shields travel along the desired path. For example, in FIGS. 1A-1D, a set of rails or bushings may be disposed on either side of each movable heat shield 170, 175, so that the heat shields slide along the desired path.

Thus, motion may be achieved in a plurality of ways. For example, the motion may be pneumatic, gear-based or stepper motion. Thus, actuator 180 may be any device capable of translating the movable heat shields 170, 175 along the desired path.

In addition, this motion may be unguided, or may be guided by rails or thru bushings. In some embodiments, an actuator 180 is not used, rather motion is achieved through manual movement of the movable heat shields 170, 175.

In some embodiments, there are exactly two positions for each movable heat shield: those shown in FIGS. 1A-B. In some embodiments, the two movable heat shields 170, 175 are moved in unison. In addition, in other embodiments, the first movable heat shield 170 and the second movable heat shield 175 may be moved independently, so that they may be in different positions.

For example, FIG. 1C shows a configuration of the apparatus 10 where the first movable heat shield 170 is in the first position, while the second movable heat shield 175 is in the second position. In this configuration, the temperature of the chamber 120 may be between that achieved in the configuration of FIG. 1A and that achieved in the configuration of FIG. 1B. Alternatively, in another configuration, the first movable heat shield 170 may be in the second position, while the second movable heat shield 175 is in the first position. Thus, using two independently controlled movable heat shields, each having exactly two operating positions, four different configurations can be created.

Figure 1D:
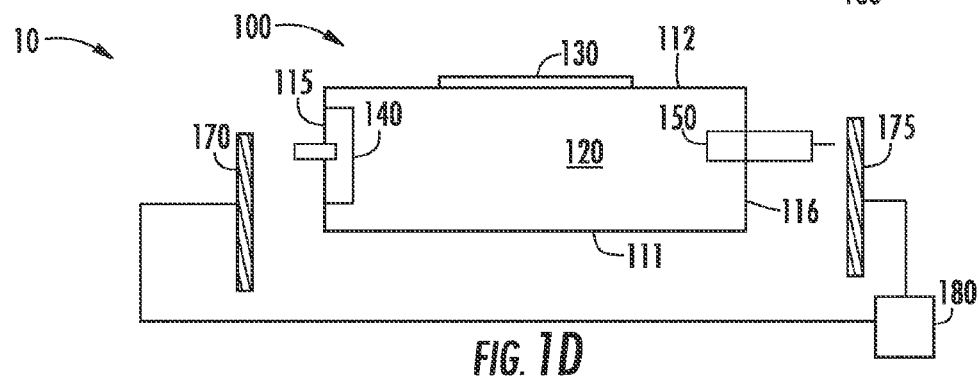

In another embodiment, each of the movable heat shields 170, 175 may be moved to at least one intermediate position, located between the first position and the second position. FIG. 1D shows a configuration where the movable heat shields 170, 175 are disposed in an intermediate position between the first position (shown in FIG. 1A) and the second position (shown in FIG. 1B). In this configuration, the chamber 120 may attain a temperature between that achieved in FIG. 1A and that achieved in FIG. 1B. In some embodiments, there is at least one such intermediate position. In other embodiments, there is a plurality of intermediate positions, allowing finer control over the temperature of the chamber 120. For example, using a stepper motor, it may be possible to move the movable heat shields 170, 175 to any position located between the first position and the second position. In the intermediate positions, the movable heat shields 170, 175 overlap a portion of respective end walls 115, 116 which is less than the portion overlapped in the first position, but greater than the portion overlapped in the second position.

While FIGS. 1A-1D show an apparatus 10 that uses two movable heat shields 170, 175 disposed proximate respective end walls 115, 116, other embodiments are also possible. For example, in some embodiments, only one movable heat shield is disposed proximate one of the end walls 115, 116. In one embodiment, the movable heat shield 175 is disposed near the end wall 116 where the repeller 150 is disposed, as this end wall 116 may be at a lower temperature than the opposite end wall. In another embodiment, the movable heat shield 170 is disposed near end wall 115 where the cathode 140 is located.

Furthermore, FIGS. 1A-1D illustrate an apparatus 10 for controlling the temperature of the ion source 100 by varying the amount of overlap between each end wall and the corresponding movable heat shield. This is performed by moving the movable heat shields in a direction parallel or nearly parallel to the plane of the end walls 115, 116. In the configuration shown in FIGS. 1A-1D, the movable heat shields 170, 175 are moved in the vertical direction.

However, other mechanisms can be used to control the amount of heat reflected back toward the ion source. For example, in another embodiment, shown in FIG. 2A-2C, an apparatus 20 is shown where the distance between the end wall and its corresponding heat shield is varied. In other words, rather than moving vertically (as shown in FIGS. 1A-1D) so as to vary the amount of overlap, the movable heat shields 170, 175 of apparatus 20 move laterally. In other words, the movable heat shields 170, 175 are moved in a direction that is perpendicular to the plane of the end walls 115, 116.

Figure 2A:
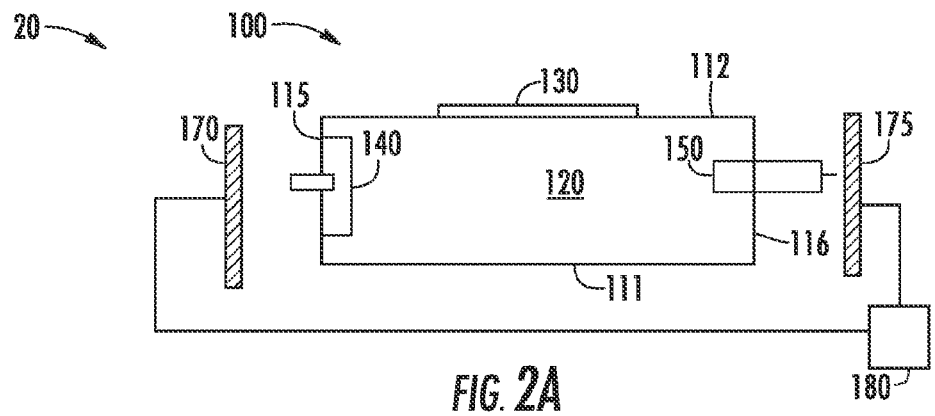
FIGS. 2A-2C show an apparatus according to a second embodiment.
Figure 2B:
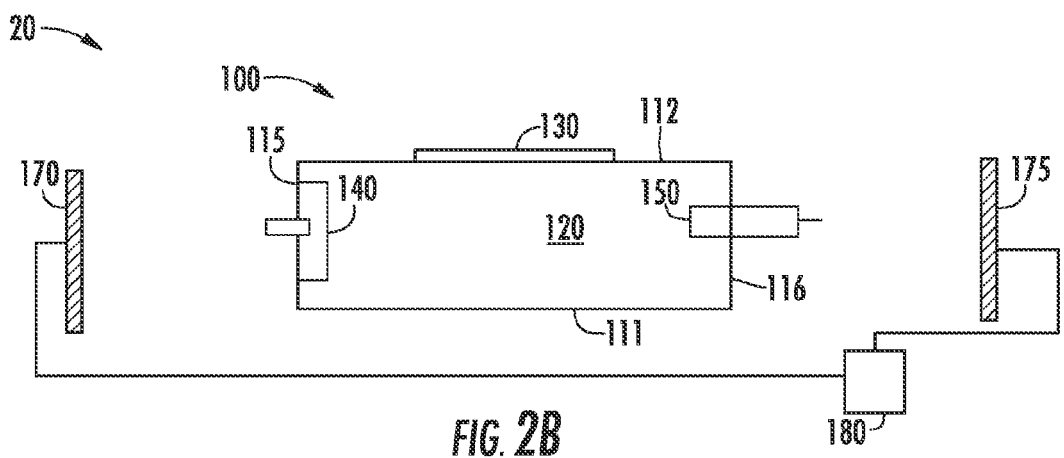
Figure 2C:
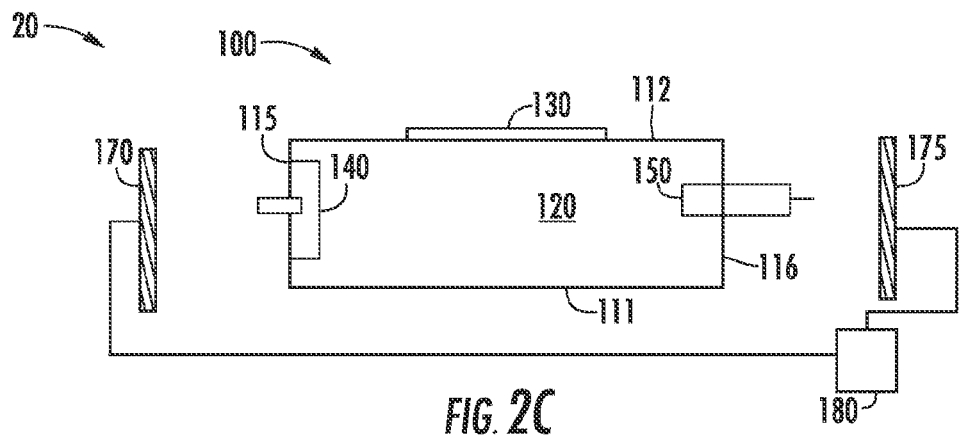

When the distance between the end wall 115, 116 and the corresponding movable heat shield 170, 175 is at the first position as shown in FIG. 2A, a first amount of heat is reflected back toward the ion source. In contrast, when the distance between the end wall 115, 116 and the corresponding movable heat shield 170, 175 is at the second position as shown in FIG. 2B, a second amount of heat is reflected back toward the ion source, where the second amount is less than the first amount of heat. As was described above, in some embodiments, there may be an intermediate position between the first position and the second position, as shown in FIG. 2C.

Thus, in apparatus 20, rather than controlling the amount of overlap between the movable heat shields 170, 175 and respective end walls 115, 116, the amount of separation between these components is controlled.

In some embodiments, the movable heat shields 170, 175 may be independently controlled so that they may be in different positions. For example, one heat shield may be in the first position while the second heat shield is in the second position. In another embodiment, as was described above, there may only be only one heat shield. In yet another embodiment, the heat shields may be moved both vertically and laterally.

As described above, while FIGS. 2A-2C show two heat shields 170, 175, other embodiments exist where only one heat shield is employed.

While FIGS. 1A-1D and 2A-2C show the movable heat shields 170, 175 disposed proximate respective end walls 115, 116, other embodiments are possible. For example, FIGS. 3A-3D show an apparatus 30 where the movable heat shields 200, 205 disposed proximate respective side walls 113, 114. In some embodiments, the side walls 113, 114 may have greater surface area than the end walls 115, 116. Thus, the effect of movable heat shields may be more pronounced in these embodiments.

Figure 3A:
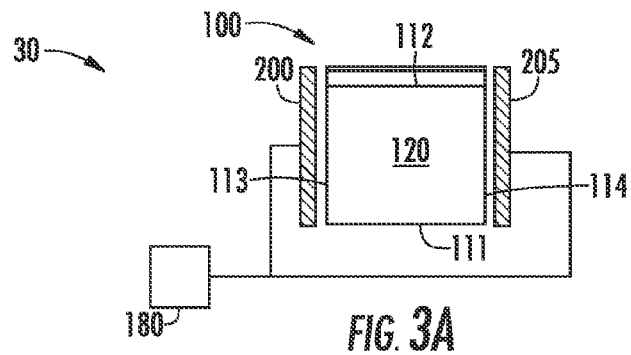
FIGS. 3A-3D show an apparatus according to a third embodiment.
Figure 3B:
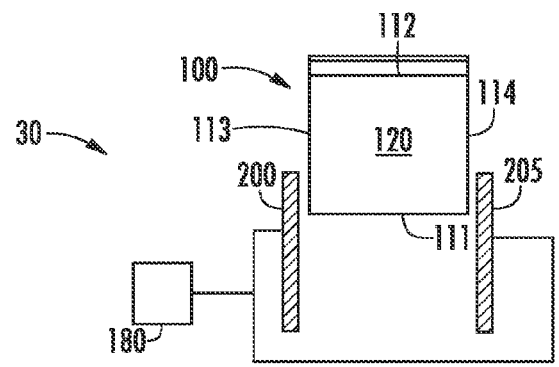

FIG. 3A shows an apparatus 30 where the movable heat shields 200, 205 are in the first position, where a first amount of heat is reflected back toward the ion source 100. FIG. 3B shows the movable heat shields 200, 205 in the second position where a second amount of heat is reflected back to the ion source 100, where the second amount is less than the first amount. The movable heat shields 200, 205 overlap a portion of respective side walls 113, 114, where the amount of overlap in the first position is greater than the amount of overlap in the second position. Like with the embodiments of FIGS. 1A-1D and FIGS. 2A-2C, an actuator 180 may be used to move the movable heat shields 200, 205 between the first position and the second position. As described above, the movement of the movable heat shields 200, 205 may be parallel or nearly parallel to the plane of respective side walls 113, 114.

Figure 3C:
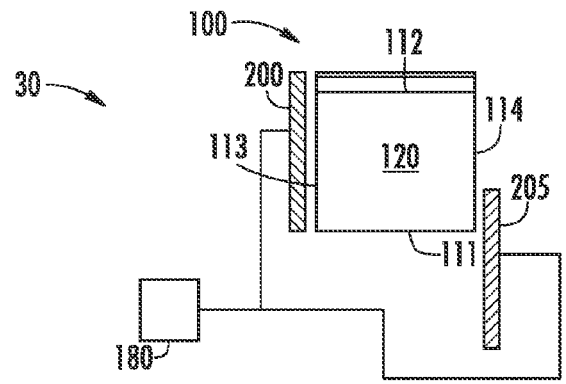

As shown in FIG. 3C, in some embodiments, the movable heat shields 200, 205 may be independently controlled so that the first movable heat shield 200 may be in the first position while the second movable heat shield 205 is in the second position. Alternatively, the second movable heat shield 205 may be in the first position while the first movable heat shield 200 may be in the second position.

Figure 3D:
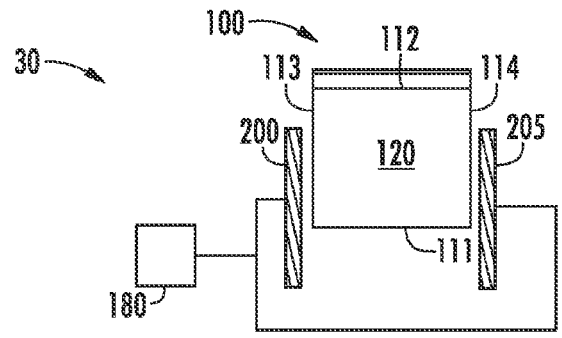

FIG. 3D shows the apparatus 30 with the movable heat shields 200, 205 in an intermediate position located between the first position and the second position. As described above, in some embodiments, there is at least one such intermediate position. In other embodiments, there is a plurality of intermediate positions, allowing finer control over the temperature of the chamber 120.

Although not shown, the movable heat shields 200, 205 may be moved laterally (or perpendicular to the plane of the side walls 113, 114), similar to the mechanism shown in FIGS. 2A-2C.

Although not shown, embodiments of the apparatus 30 with only one heat shield may be employed.

In addition, the apparatuses shown in the embodiments of FIGS. 1A-1D and 3A-3D may be combined, such that heat shields are provided proximate to the end walls 115, 116 and the side walls 113, 114. In one embodiment, these movable heat shields 170, 175, 200, 205 may all move independently. In another embodiment, the heat shields may be moved as pairs, such that the movable heat shields 170, 175 move in unison and the movable heat shields 200, 205 move in unison. In one alternate embodiment, the heat shields may move parallel to the direction of the planes of the ends walls and the side walls (i.e. vertically, as shown in FIGS. 1A-1D and 3A-3D). In another embodiment, the heat shields may move perpendicular to the direction of the planes of the end walls and the side walls (i.e. laterally, as shown in FIGS. 2A-2C.

Additionally, a heat shield may be disposed proximate the bottom wall 111, if desired. As with any of the heat shields, it may be moved parallel to the direction of the plane of the bottom wall 111, or perpendicular to that plane.

Figure 4A:
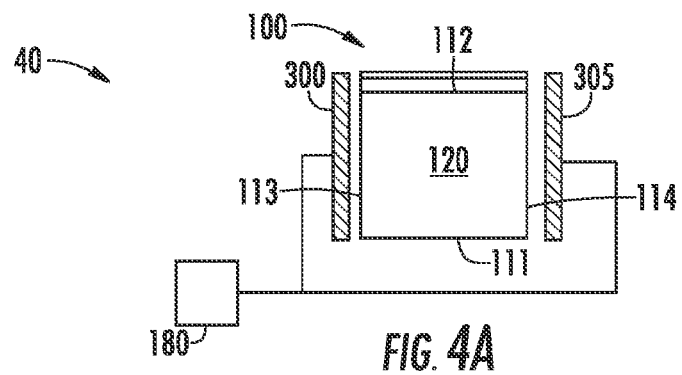
FIGS. 4A-4D show an apparatus according to a fourth embodiment.

The apparatus shown in the embodiments of FIGS. 1A-1D, 2A-2C and 3A-3D all show the heat shields being moved along a linear path. However, other embodiments are also possible. For example, FIGS. 4A-4D show an apparatus 40 where the movable heat shields 300, 305 are pivotally rotated. In FIG. 4A, the apparatus 40 has the movable heat shields 300, 305 in a first position, where a first amount of heat is reflected back toward the chamber 120. In one embodiment, the movable heat shields 300, 305 are parallel to the plane of the side walls 113, 114, although other angles are also possible Furthermore, although FIGS. 4A-4D show an apparatus 40 with the movable heat shields 300, 305 disposed proximate the side walls 113, 114, it is understood that these heat shields may be disposed proximate the end walls 115, 116. In another embodiment, the heat shields may be disposed proximate all four of these walls if desired.

Figure 4B:
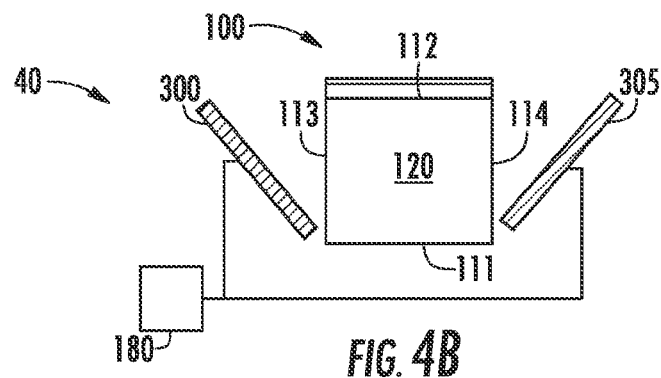

FIG. 4B shows the apparatus 40 with the movable heat shields 300, 305 in the second position where a second amount of heat is reflected back toward the chamber 120, wherein the second amount is less than the first amount. This is achieved by increasing the angle formed between the side wall 113, 114 and its corresponding movable heat shield 300, 305. While FIG. 4B shows an angle of approximately 45°, other angles are also possible. The angle of the second position may be selected to as to achieve the desired minimum temperature.

In other words, in the first position, the movable heat shields 300, 305 form a first angle with their respective side walls 113,114. In the second position, the movable heat shields 300, 305 form a second angle with their respective side walls 113, 114, where the second angle is greater than the first angle.

This rotational movement is achieved using an actuator 180 in communication with the movable heat shields 300, 305. The movable heat shields 300, 305 may each be rotatably attached to a respective pivot point. This may comprise an axle, hinge or other pivotable mechanism. When the angle is increased, more of the heat is reflected in a direction where it does not reach the chamber 120. Thus, an increased angle may reflect less heat back toward the chamber 120, resulting in a lower temperature.

Figure 4C:
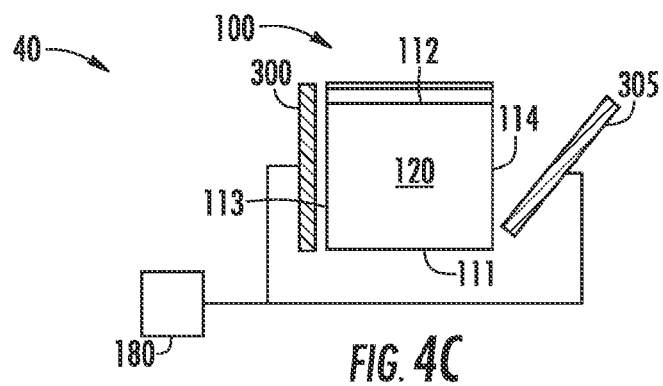

As described above, the movable heat shields 300, 305 of apparatus 40 may be moved independently. FIG. 4C shows the first movable heat shield 300 in the first position, while the second movable heat shield 305 is in the second position. Alternatively, the first movable heat shield 300 may be in the second position, while the second movable heat shield 305 is in the first position.

Figure 4D:
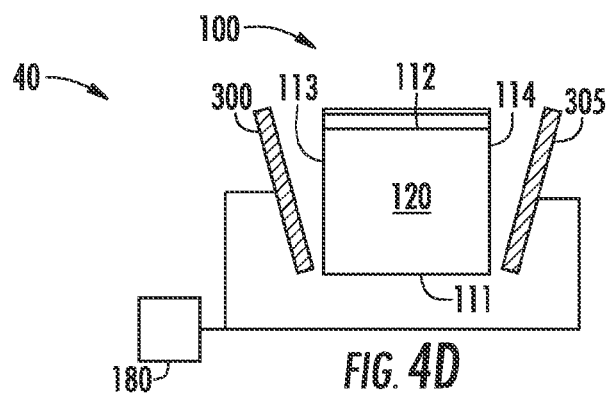

In some embodiments, the movable heat shields 300, 305 may be moved to an intermediate position between the first position and the second position, as shown in FIG. 4D. As described above, in some embodiments, there is a plurality of intermediate positions, allowing finer control over the temperature of the chamber 120. In the intermediate positions, the angle formed by the movable heat shields 300, 305 and its respective side wall 113, 114 is between the first angle and the second angle.

Although not shown, embodiments of the apparatus 40 with only one heat shield may be employed.

The embodiments described herein are beneficial in situations where it is desirable to have the ion source operate at a plurality of different temperatures. By moving the movable heat shields, the ion source 100 may be operated at a plurality of temperatures. Additionally, the use of movable heat shields may make the time needed to transition between relatively cold temperatures and relatively hot temperatures much shorter than would otherwise be possible. Furthermore, this may be performed without modification of the ion source.

In addition, while the above embodiments show an ion source having a cathode and a repeller, the disclosure is not limited to this embodiment. Other types of ion sources may be employed with the apparatus, where ions are generated within a chamber. For example, in some embodiments, RF energy may be used to create the ions within the ion source. The movable heat shields may be disposed proximate one or more walls in this embodiment as well.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus comprising:
    an ion source having a plurality of walls defining a chamber; and
    a movable heat shield disposed outside the chamber and proximate at least one of the walls, where the movable heat shield has a first position where a first amount of heat is reflected back toward the chamber and a second position where a second amount of heat is reflected back toward the chamber, the second amount of heat being less than the first amount of heat.

2. The apparatus of claim 1, wherein the plurality of walls comprises a bottom wall, a top wall with an aperture, two end walls and two side walls, where a cathode is disposed proximate one of the two end walls, and wherein the movable heat shield is disposed proximate one of the two end walls.

3. The apparatus of claim 2, wherein the movable heat shield moves in a direction parallel to a plane of a first of the two end walls and in the first position, the movable heat shield overlaps a portion of a first end wall, and in the second position, the movable heat shield overlaps a smaller portion of the first end wall.

4. The apparatus of claim 2, wherein the movable heat shield rotates about a pivot point proximate a first of the two end walls and in the first position, the movable heat shield forms a first angle with a first end wall, and in the second position, the movable heat shield forms a second angle with the first end wall, the second angle greater than the first angle.

5. The apparatus of claim 1, wherein the plurality of walls comprises a bottom wall, a top wall with an aperture, two end walls and two side walls, where a cathode is disposed proximate one of the two end walls, and wherein the movable heat shield is disposed proximate one of the two side walls.

6. The apparatus of claim 5, wherein the movable heat shield moves in a direction parallel to a plane of a first of the side walls and in the first position, the movable heat shield overlaps a portion of the first side wall, and in the second position, the movable heat shield overlaps a smaller portion of the first side wall.

7. The apparatus of claim 5, wherein the movable heat shield rotates about a pivot point proximate a first of the side walls and in the first position, the movable heat shield forms a first angle with the first side wall, and in the second position, the movable heat shield forms a second angle with the first side wall, greater than the first angle.

8. The apparatus of claim 1, further comprising an actuator in communication with the movable heat shield to move the movable heat shield between the first position and the second position.

9. An apparatus, comprising:
- an ion source having a plurality of walls defining a chamber, wherein the plurality of walls comprises a bottom wall, a top wall with an aperture, two end walls and two side walls, where a cathode is disposed proximate one of the two end walls;
- two movable heat shields, each disposed outside the chamber and proximate a respective one of the two side walls, where each of the two movable heat shields has a first position where a first amount of heat is reflected back toward the chamber and a second position where a second amount of heat is reflected back toward the chamber, where the second amount is less than the first amount; and
- an actuator in communication with each of the movable heat shields, to move each of the movable heat shields in a direction parallel to a plane of the side walls between the first position and the second position, wherein in the first position, the movable heat shields overlap a portion of the side walls, and in the second position, the movable heat shields overlap a smaller portion of the side walls.

10. The apparatus of claim 9, wherein the actuator moves the movable heat shields independently.

11. The apparatus of claim 9, wherein the actuator moves each of the movable heat shields to at least one intermediate position between the first position and the second position.

12. The apparatus of claim 9, further comprising rails to guide the movable heat shields along a desired path between the first position and the second position.

13. The apparatus of claim 9, further comprising a second set of movable heat shields, each disposed proximate a respective one of the two end walls, and in communication with the actuator.

14. An apparatus, comprising:
- an ion source having a plurality of walls defining a chamber, wherein the plurality of walls comprises a bottom wall, a top wall with an aperture, two end walls and two side walls, where a cathode is disposed proximate one of the two end walls;
- two movable heat shields, each disposed outside the chamber and proximate a respective one of the two side walls, where each of the movable heat shields has a first position where a first amount of heat is reflected back toward the chamber and a second position where a second amount of heat is reflected back toward the chamber, the second amount being less than the first amount; and
- an actuator in communication with each of the movable heat shields, to rotate each of the movable heat shields about a respective pivot point, wherein in the first position, the movable heat shields form a first angle with the respective side wall, and in the second position, the movable heat shields form a second angle with the respective side wall, greater than the first angle.

15. The apparatus of claim 14, wherein the actuator rotates the movable heat shields independently.

16. The apparatus of claim 14, wherein the actuator rotates each of the movable heat shields to at least one intermediate position between the first position and the second position.

* * * * *